US010720212B2

(12) United States Patent
Lee (10) Patent No.: US 10,720,212 B2
(45) Date of Patent: *Jul. 21, 2020

(54) MEMORY DEVICE AND METHOD OF OPERATING THE SAME

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/393,780

(22) Filed: Apr. 24, 2019

(65) Prior Publication Data

US 2019/0252023 A1   Aug. 15, 2019

Related U.S. Application Data

(63) Continuation of application No. 15/950,610, filed on Apr. 11, 2018, now Pat. No. 10,319,443, which is a continuation of application No. 15/060,726, filed on Mar. 4, 2016, now Pat. No. 9,978,453.

(30) Foreign Application Priority Data

Sep. 25, 2015 (KR) .................. 10-2015-0136172

(51) Int. Cl.
| | |
|---|---|
| *G11C 16/06* | (2006.01) |
| *G11C 5/02* | (2006.01) |
| *G11C 16/04* | (2006.01) |
| *G11C 16/10* | (2006.01) |
| *G11C 16/34* | (2006.01) |

(52) U.S. Cl.
CPC .............. *G11C 16/06* (2013.01); *G11C 5/02* (2013.01); *G11C 16/0483* (2013.01); *G11C 16/10* (2013.01); *G11C 16/34* (2013.01)

(58) Field of Classification Search
None
See application file for complete search history.

(56) References Cited

U.S. PATENT DOCUMENTS

| | | | |
|---|---|---|---|
| 6,128,219 A | 10/2000 | Pio et al. | |
| 2006/0152272 A1 | 7/2006 | Sueoka | |
| 2008/0205162 A1* | 8/2008 | Jeon ............... | G11C 11/5621 365/185.23 |
| 2013/0148427 A1 | 6/2013 | Lee | |
| 2014/0247665 A1 | 9/2014 | Avila et al. | |
| 2014/0293702 A1 | 10/2014 | Dong et al. | |

FOREIGN PATENT DOCUMENTS

| | | |
|---|---|---|
| CN | 106157999 A | 11/2016 |
| KR | 1020090080588 A | 7/2009 |
| KR | 1020090106909 A | 10/2009 |
| WO | 9530226 A1 | 11/1995 |

* cited by examiner

*Primary Examiner* — James G Norman
(74) *Attorney, Agent, or Firm* — William Park & Associates Ltd.

(57) ABSTRACT

A memory device with a plurality of memory block may include a plurality of memory cells constituting a memory blocks, and two or more select transistors coupled to the plurality of memory cells constituting the memory block and configured to select the memory block, the two or more select transistors having different threshold voltages from one another.

7 Claims, 7 Drawing Sheets

| SST42 | SST41 |
|---|---|
| −2V | 4V |
| SST32 | SST31 |
| 0 | 2V |
| SST22 | SST21 |
| 2V | 0V |
| SST12 | SST11 |
| 4V | −2V |

[ CODED SST ]

FIG. 6

| | SST42 | SST41 |
|---|---|---|
| CSL4 | 6V | 0V |
| CSL3 | SST32 | SST31 |
| | 4V | 2V |
| CSL2 | SST22 | SST21 |
| | 2V | 4V |
| CSL1 | SST12 | SST11 |
| | 0V | 6V |
| SSL2 | Vpgm | Vpass1 |
| SSL1 | Vpass2 | Vpgm |
| | GR2 CODING METHOD | GR1 CODING METHOD |

FIG. 7

| Sel. CSL | 0V | 0V |
|---|---|---|
| Unsel. CSL | Vinh | Vinh |
| SSL2 | Vpgm | Vpass1 |
| SSL1 | Vpass2 | Vpgm |
| | GR2 CODING METHOD | GR1 CODING METHOD |

|  |  | CSL | DSSL | SSL1 | SSL2 | WL | DSL | BL |
|---|---|---|---|---|---|---|---|---|
| Sel. MB | GR1 CODING | VDD | Voff | Vpgm | Vpass1 | Vpass3 | Von | 0V→VDD |
|  | GR2 CODING |  |  | Vpass2 | Vpgm |  |  |  |
| Unsel. MB |  |  |  | CHANNEL BOOSTING | | | Voff | |

MEMORY DEVICE AND METHOD OF OPERATING THE SAME

CROSS-REFERENCE TO RELATED APPLICATION

The present application is a continuation U.S. application of application Ser. No. 15/950,610, filed on Apr. 11, 2018, which is a continuation U.S. application of application Ser. No. 15/060,726, filed on Mar. 4, 2016, and claims priority under 35 U.S.C. § 119(a) to Korean patent application number 10-2015-0136172 filed on Sep. 25, 2015, in the Korean Intellectual Property Office, the entire disclosure of which is incorporated herein by reference.

BACKGROUND

1. Technical Field

Various embodiments of the present disclosure generally relate to a memory device and a method of operating the memory device, and more particularly to a memory device including select transistors and a method of operating the memory device.

2. Related Art

A memory device includes a memory cell array which stores data, a peripheral circuit which performs a program operation, a read operation, and an erase operation on the memory cell array, and a control circuit which control operations of the peripheral circuit.

The memory cell array may include vertical memory cell strings. The memory cell array may be subdivided into a plurality of memory blocks. The vertical memory cell strings may be connected between common source lines and bit lines. Each memory cell string may include source select transistors, memory cells, and drain select transistors connected in series between a common source line and a bit line.

The gates of the source select transistors, the gates of the memory cells, and the gates of the drain select transistors included in different memory cell strings are connected to source select lines, word lines, and drain select lines, respectively.

As a result, memory blocks of the memory cell array having vertical memory cell strings may be arranged in a vertical direction from a substrate. The memory blocks may share bit lines, source select lines, word lines, and drain select lines with each other.

DETAILED DESCRIPTION

In an embodiment, a memory device with a plurality of memory block may include a plurality of memory cells constituting a memory blocks, and two or more select transistors coupled to the plurality of memory cells constituting the memory block and configured to select the memory block, the two or more select transistors having different threshold voltages from one another.

In an embodiment, a memory device may include a first memory block including a first source select transistor, a second source select transistor, first memory cells, a first drain select transistor, and a second drain select transistor coupled in series between a first common source line and a bit line. The memory device may include a second memory block disposed over the first memory block and including a third source select transistor, a fourth source select transistor, second memory cells, a third drain select transistor, and a fourth drain select transistor coupled in series between a second common source line and the bit line. The memory device may include a peripheral circuit configured to program the first to fourth source select transistors. The memory device may include a control circuit configured to perform a program operation on the first to fourth source select transistors so that the first to fourth source select transistors have different threshold voltages from one another; and to control the peripheral circuit so that, when a program operation, a read operation or an erase operation is performed, the first memory block or the second memory block is electrically connected to the first common source line by applying a corresponding combination of voltages to a first source select line coupled in common to the first and third source select transistors and to a second source select line coupled in common to the second and fourth source select transistors.

In an embodiment, a method of operating a memory device may be provided. The method may include programming select transistors of memory blocks, including applying different voltages to common source lines respectively coupled to the memory blocks; and simultaneously programming source select transistors among the select transistors, wherein the source select transistors are included in the stacked memory blocks, are coupled between memory cells and the common source lines, and are coupled to an identical source select line Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, preferred embodiments of the present disclosure will be described in detail with reference to the attached drawings. However, the present disclosure is not limited to embodiments which will be described below and may be implemented in various ways. The embodiments of the present disclosure are intended to fully describe the present invention to a person having ordinary knowledge in the art to which the present invention pertains. Rather, these embodiments are provided so that this disclosure will be thorough and complete, and will fully convey the scope of the example embodiments to those skilled in the art.

Figure 1:
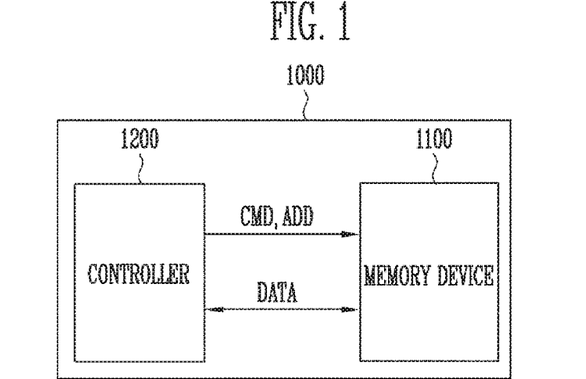
FIG. 1 is a diagram illustrating an example of a memory system according to an embodiment of the present disclosure.

FIG. 1 is a diagram illustrating an example of a memory system according to an embodiment of the present disclosure.

Referring to FIG. 1, a memory system 1000 includes a memory device 1100 for storing data, and a controller 1200 for controlling the memory device 1100.

The memory device 1100 performs operations such as a program operation, a read operation, and an erase operation in response to a command CMD and an address ADD. The memory device 1100 may include a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR) SDRAM, a Rambus Dynamic Random Access Memory (RDRAM) or a Flash memory. In the following embodiment, a memory device 1100 including a NAND flash memory will be described by way of example.

The controller 1200 controls the overall operation of the memory device 1100. The controller 1200 controls the overall operation of the memory device 1100 may transmit a command CMD, an address ADD and data DATA to control the memory device 1100 and receive data DATA from the memory device 1100 in response to a command received from an external device (e.g. a host) of the memory system, FIG. 2 is a diagram illustrating an example of the memory device of FIG. 1 in detail.

Figure 2:
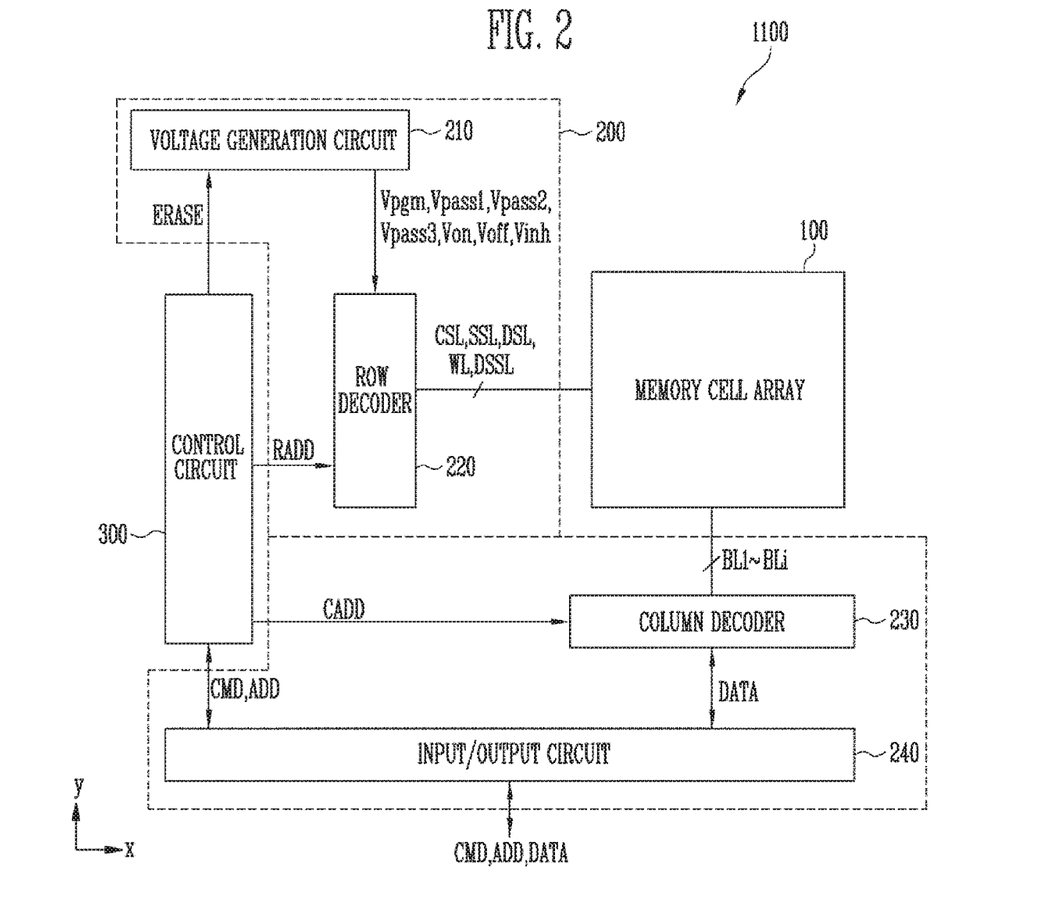
FIG. 2 is a diagram illustrating in detail an example of the memory device of FIG. 1.

Referring to FIG. 2, the memory device 1100 may include a memory cell array 100 which stores data, a peripheral circuit 200 which performs operations such as a program operation, a read operation, and an erase operation, and a control circuit 300 which controls operations the peripheral circuit 200.

The memory cell array 100 may include memory blocks, each including multiple memory cells storing data.

The peripheral circuit 200 may include a voltage generation circuit 210, a row decoder 220, a column decoder 230, and an input/output (I/O) circuit 240.

The voltage generation circuit 210 may generate voltages having various levels in response to an operation signal OP. For example, the voltage generation circuit 210 may generate a program voltage Vpgm, a first pass voltage Vpass1, a second pass voltage Vpass2, a third pass voltage Vpass3, a turn-on voltage Von, a turn-off voltage Voff, a program inhibition voltage Vinh, etc. In addition, the voltage generation circuit 210 may generate voltages having various levels required for the program operation, read operation, and erase operation.

The row decoder 220 transfers the voltages Vpgm, Vpass1, Vpass2, Vpass3, Von, Voff, and Vinh generated by the voltage generation circuit 210 to local lines CSL, SSL, DSL, WL, or DSSL coupled to a selected memory block of the memory cell array 100 in response to a row address RADD. The local lines CSL, SSL, DSL, WL, and DSSL may include common source lines CSLs, source select lines SSLs, drain select lines DSLs, word lines WLs, and dummy source select lines DSSLs.

The column decoder 230 is coupled to the memory cell array 100 through bit lines BL1 to BLi (where i is a natural number). The column decoder 230 may exchange data through the bit lines BL1 to BLi in response to a column address CADD.

The I/O circuit 240 may transfer the command CMD and the address ADD received from a controller (e.g., the controller 1200 of FIG. 1) to the control circuit 300 or exchange data DATA with the column decoder 230.

The control circuit 300 may output an operation signal OP, a row address RADD, and a column address CADD required to control the peripheral circuit 200 in response to the command CMD and the address ADD. The control circuit 300 may control the peripheral circuit 200 so that source select transistors or drain select transistors included in the memory cell array may have various threshold voltages. For example, each memory block may correspond to a certain combination of the threshold voltages of the source select transistors or drain select transistors, and the control circuit 300 may control the peripheral circuit 200 so that, in response to a certain voltage, some of differently coded select transistors are turned on and the remaining differently coded select transistors are turned off. For example, a particular memory block may be selected in response to a particular combination of voltages being applied to the source select transistors having a particular combination of threshold voltages.

Figure 3:
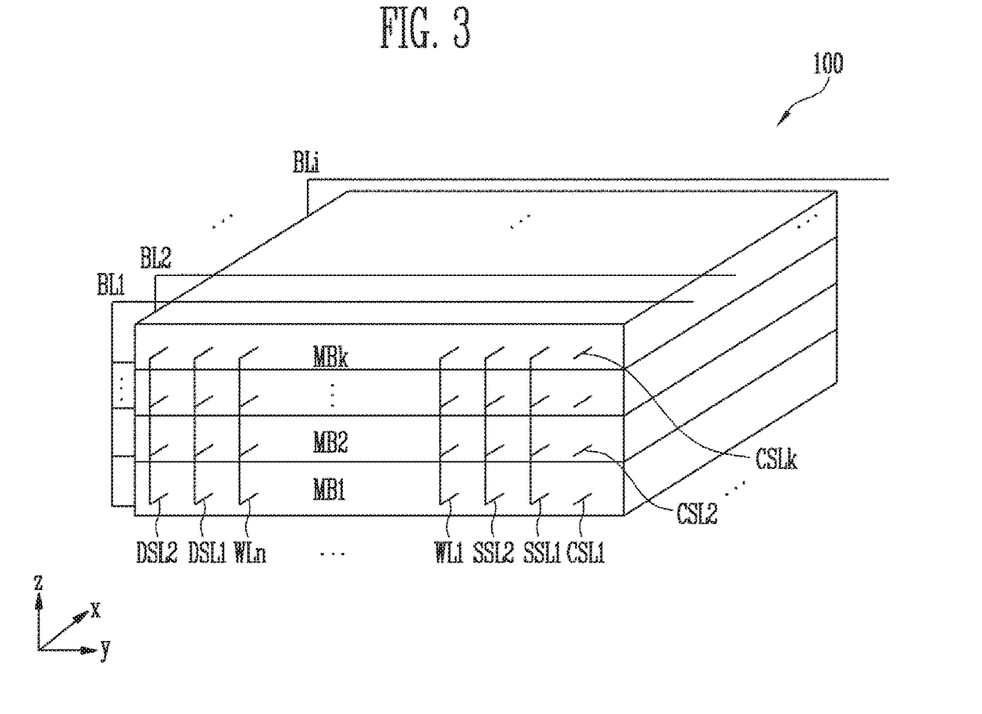
FIG. 3 is a diagram illustrating in detail an example of the memory cell array of FIG. 2.

FIG. 3 is a diagram illustrating in detail an example of the memory cell array of FIG. 2.

Referring to FIG. 3, the memory cell array 100 may include multiple memory blocks MB1 to MBk (where k is a natural number). The memory blocks MB1 to MBk may be arranged in a vertical direction from a substrate (e.g., z direction). For example, a second memory block MB2 may be arranged over a first memory block MB1, a third memory block MB3 may be arranged over the second memory block MB2, and a $k^{th}$ memory block MBk may be arranged over a $k-1^{th}$ memory block MBk-1.

The first to $k^{th}$ memory blocks MB1 to MBk may share multiple bit lines BL1 to BLi, which extend along a first direction (e.g., X direction), with each other, and share a first source select line SSL1, a second source select line SSL2, first to $n^{th}$ word lines WL1 to WLn, a first drain select line DSL1, and a second drain select line DSL2, which extend along a second direction (e.g., Y direction), but they do not share first to $k^{th}$ common source lines CSL1 to CSLk with each other. For example, the first common source line CSL1 may be coupled to the first memory block MB1, and the $k^{th}$ common source line CSLk may be coupled to the $k^{th}$ memory block MBk.

Figure 4:
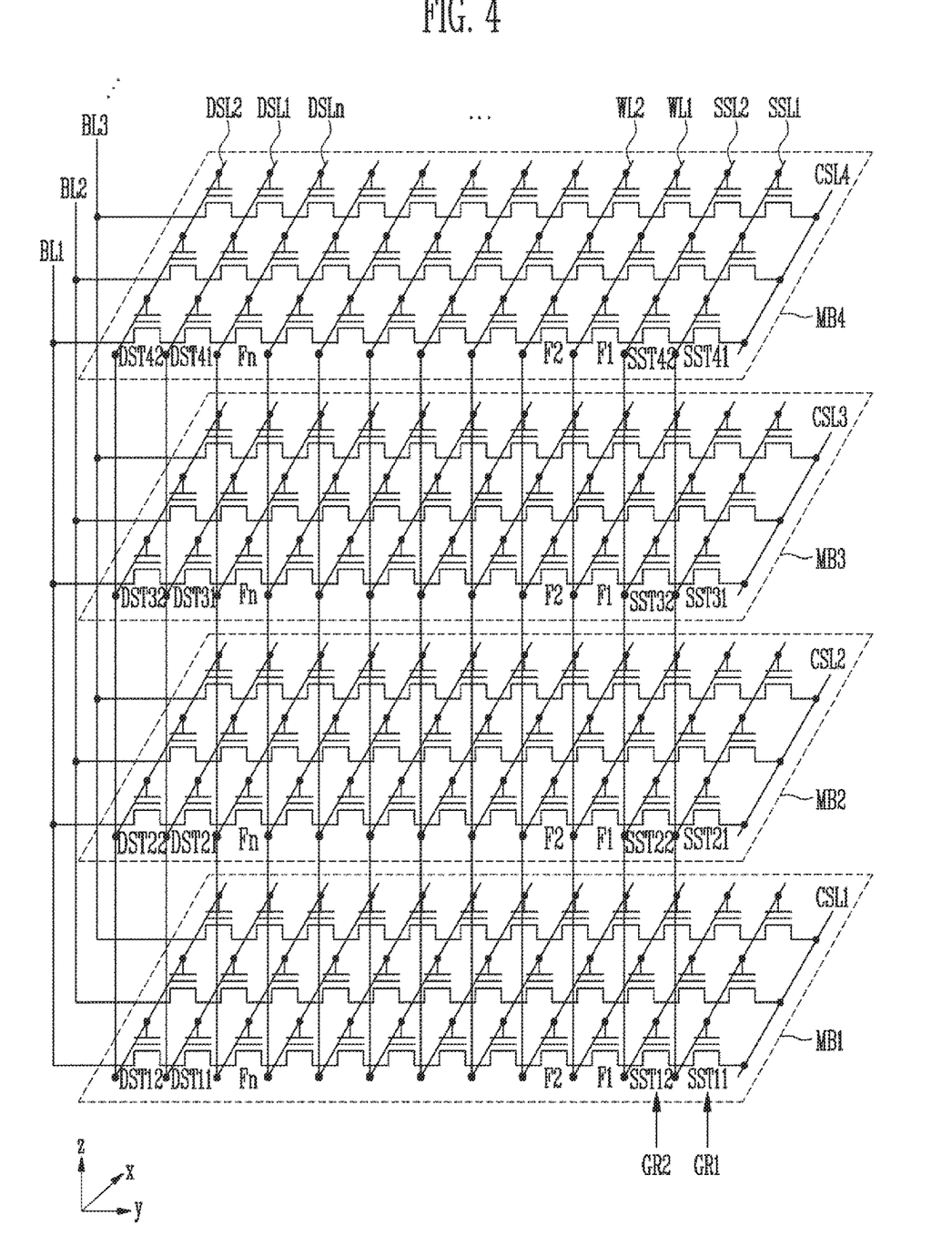
FIG. 4 is a diagram illustrating in detail examples of memory blocks according to an embodiment of the present disclosure.

FIG. 4 is a diagram illustrating in detail an example of memory blocks according to an embodiment of the present disclosure.

Referring to FIG. 4, an example that includes first to fourth memory blocks MB1 to MB4 in the memory cell array 100 of FIG. 3 is described.

Since the first to fourth memory blocks MB1 to MB4 may have a similar structure, the first memory block MB1 out of the first to fourth memory blocks MB1 to MB4 will be described in detail below.

The first memory block MB1 may include multiple memory cell strings connected between bit lines BL1, BL2, BL3, . . . and a first common source line Cal. For example, a memory cell string coupled between the first bit line BL1 and the first common source line CSL1 may include an $11^{th}$ source select transistor SST11, a $12^{th}$ source select transistor SST12, first to $n^{th}$ memory cells F1 to Fn, a $11^{th}$ drain select transistor DST11, and a $12^{th}$ drain select transistor DST12. Multiple memory cell strings arranged along a first direction (e.g., X direction) may be included in the first memory block MB1. The second memory block MB2 may be configured in the same way as the first memory block MB1, and may be arranged over the first memory block MB1 in a vertical direction (e.g., Z direction). In this way, the first to fourth memory blocks MB1 to MB4 may be arranged in the vertical direction (e.g., Z direction) from the substrate.

The $21^{st}$ source select transistor SST21 of the second memory block MB2 may be disposed over the $11^{th}$ source select transistor SST11 of the first memory block MB1, the $31^{st}$ source select transistor SST31 of the third memory block MB3 may be disposed over the $21^{st}$ source select transistor SST21, and the $41^{st}$ source select transistor SST41 of the fourth memory block MB4 may be disposed over the $31^{st}$ source select transistor SST31. The gates of the $11^{th}$, $21^{st}$, $31^{st}$, and $41^{st}$ source select transistors SST11, SST21, SST31, and SST41 respectively included in the first to fourth memory blocks MB1 to MB4 may be coupled in common to the first source select line SSL1. For the convenience of description, the $11^{th}$, $21^{st}$, $31^{st}$, and $41^{st}$ source select transistors SST11, SST21, SST31, and SST41 coupled in common to the first source select line SSL1 may be defined as a first group GR1.

The $22^{nd}$ source select transistor SST22 of the second memory block MB2 may be disposed over the $12^{th}$ source select transistor SST12 of the first memory block MB1, the $32^{nd}$ source select transistor SST32 of the third memory block MB3 may be disposed over the 22-th source select transistor SST22, and the $42^{nd}$ source select transistor SST42 of the fourth memory block MB4 may be disposed over the $32^{nd}$ source select transistor SST32. The gates of the $12^{th}$, $22^{nd}$, $32^{nd}$, and $42^{nd}$ source select transistors SST12, SST22, SST32, and SST42 respectively included in the first to fourth memory blocks MB1 to MB4 may be coupled in common to the second source select line SSL2. For the convenience of description, the $12^{th}$, $22^{nd}$, $32^{nd}$, and $42^{nd}$ source select transistors SST12, SST22, SST32 and SST42 coupled in common to the second source select line SSL2 are defined as a second group GR2.

The $21^{st}$ drain select transistor DST21 of the second memory block MB2 may be disposed over the $11^{th}$ drain select transistor DST11 of the first memory block MB1, the $31^{st}$ drain select transistor DST31 of the memory block MB3 may be dispose over the $21^{st}$ drain select transistor DST21, and the $41^{st}$ drain select transistor DST41 of the fourth memory block MB4 may be disposed over the $31^{st}$ drain select transistor DST31. The gates of the $11^{th}$, $21^{st}$, $31^{st}$, and $41^{st}$ drain select transistors DST11, DST21, DST31 and DST41 respectively included in the first to fourth memory blocks MB1 to MB4 may be coupled in common to the first drain select line DSL1.

The $22^{nd}$ drain select transistor DST22 of the second memory block MB2 may be disposed over the $12^{th}$ drain select transistor DST12 of the first memory block MB1, the $32^{nd}$ drain select transistor DST32 of the third memory block MB3 may be disposed over the $22^{nd}$ drain select transistor DST22, and the $42^{nd}$ drain select transistor DST42 of the fourth memory block MB4 may be disposed over the $32^{nd}$ drain select transistor DST32. The gates of the $12^{th}$, $22^{nd}$, $32^{nd}$ and $42^{nd}$ drain select transistors DST12, DST22, DST32, and DST42 respectively included in the first to fourth memory blocks MB1 to MB4 may be coupled in common to the second drain select line DSL2.

In order to distinguish a memory block selected between the stacked first to fourth memory blocks MB1 to MB4 from the remaining unselected memory blocks, the $11^{th}$, $21^{st}$, $31^{st}$, and $41^{st}$ source select transistors SST11, SST21, SST31 and SST41 and the $12^{th}$, $22^{nd}$, $32^{nd}$, and $42^{nd}$ source select transistors SST12, SST22, SST32, and SST42 are coded to have different threshold voltages. For example, the $11^{th}$, $21^{st}$, $31^{st}$, and $41^{st}$ source select transistors SST11, SST21, SST31 and SST41 included in the first group GR1 may be differently coded, and the $12^{th}$, $22^{nd}$, $32^{nd}$ and $42^{nd}$ source select transistors SST12, SST22, SST32 and SST42 included in the second group GR2 may also be differently coded. For example, each of the $11^{th}$, $21^{st}$, $31^{st}$, and $41^{st}$ source select transistors SST11, SST21, SST31 and SST41 included in the first group GR1 may have a different threshold voltage from one another, and each of the $12^{th}$, $22^{nd}$, $32^{nd}$ and $42^{nd}$ source select transistors SST12, SST22, SST32 and SST42 included in the second group GR2 may have a different threshold voltage from one another.

If the source select transistors SST11, SST21, SST31, SST41, SST12, SST22, SST32, and SST42 included in the first and second groups GR1 and GR2 are coded to have different threshold voltages, whether the $11^{th}$, $21^{st}$, $1^{st}$ and $41^{st}$ source select transistors SST11, SST21, SST31 and SST41 included in the first group GR1 may be turned on in response to a particular voltage applied to the first source select line SSL1 coupled to the first group GR1 may be determined based on the threshold voltage of each source select transistor. Further, some of the $12^{th}$, $22^{nd}$, $32^{nd}$ and $42^{nd}$ source select transistors SST12, SST22, SST32 and SST42 included in the second group GR2 may be turned on or off even if any voltage is applied to the second source select line SSL2 connected to the second group GR2.

Similarly, the $11^{th}$, $21^{st}$, $31^{st}$ and $41^{st}$ drain select transistors DST11, DST21, DST31 and DST41 and the $12^{th}$, $22^{nd}$, $32^{nd}$ and $42^{nd}$ drain select transistors DST12, DST22, DST32 and DST42 may also be differently coded.

The source select transistors SST11, SST21, SST31, SST41, SST12, SST22, SST32 and SST42 coded to have different threshold voltages will be described in detail below.

Figure 5:
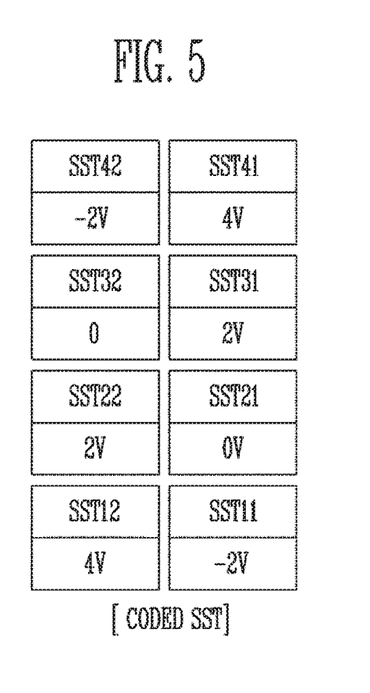
FIG. 5 is a diagram illustrating an example of the threshold voltages of coded select transistors according to an embodiment of the present disclosure.

FIG. 5 is a diagram illustrating an example of the threshold voltages of coded select transistors according to an embodiment of the present disclosure.

Although FIG. 5 illustrates that source select transistors SST11, SST21, SST31, SST41, SST12, SST22, SST32 and SST42 differently coded have particular threshold voltage levels, those threshold voltage levels are not limited thereto, and thus the source select transistors may have different combinations of threshold voltages depending on, for example, the types of memory devices.

For example, if the $11^{th}$ source select transistor SST11 is coded to have a threshold voltage of −2V, the $21^{st}$ source select transistor SST21 may be coded to have a threshold voltage of 0V, the $31^{st}$ source select transistor SST31 may be coded to have a threshold voltage of 2V, and the $41^{st}$ source select transistor SST41 may be coded to have a threshold voltage of 4V.

The $12^{th}$, $22^{nd}$, $32^{nd}$ and $42^{nd}$ source select transistors SST12, SST22, SST32 and SST42, respectively included in the same memory blocks as the $21^{st}$, $31^{st}$ and $41^{st}$ source select transistors SST11, SST21, SST31 and SST41, are coded to have threshold voltages different from those of the $11^{th}$, $21^{st}$, $31^{st}$ and $41^{st}$ source select transistors SST11, SST21, SST31 and SST41.

For example, the $12^{th}$ source select transistor SST12 may be coded to have a threshold voltage of 4V, the $22^{nd}$ source select transistor SST22 may be coded to have a threshold voltage of 2V, the $32^{nd}$ source select transistor SST32 may be coded to have a threshold voltage of 0V, and the $42^{nd}$ source select transistor SST42 may be coded to have a threshold voltage of −2V.

As described above, if the source select transistors SST11, SST21, SST31, SST41, SST12, SST22, SST32, and SST42 are differently coded, the common source line may become electrically connected only to a selected memory block by applying the corresponding combination of voltages to the first source select line SSL1 (of FIG. 4) and the second source select line SSL2. That is, all the source select transistors included in the selected memory block are turned on, whereas at least one of the source select transistors included in the unselected memory blocks are turned off, and thus the selected memory block and the unselected memory blocks may be distinguished from each other.

TABLE 1

| SSL2 −1 V | SSL1 5 V | SSL2 1 V | SSL1 3 V | SSL2 3 V | SSL1 1 V | SSL2 5 V | SSL1 −1 V |
|---|---|---|---|---|---|---|---|
| ON | ON | ON | OFF | ON | OFF | ON | OFF |
| OFF | ON | ON | ON | ON | OFF | ON | OFF |
| OFF | ON | OFF | ON | ON | ON | ON | OFF |
| OFF | ON | OFF | ON | OFF | ON | ON | ON |
| MB4 | | MB3 | | MB2 | | MB1 | |

Referring to Table 1, in order to electrically connect the first memory block MB1 to the first common source line CLS1 by selecting the first memory block MB1, a voltage (e.g. −1V) that is higher than the threshold voltage of the $11^{th}$ source select transistor SST11 is applied to the first source select line SSL1, and a voltage (e.g. 5V) that is higher than the threshold voltage of the 12-th source select transistor SST12 is applied to the second source select line SSL2. As a result, both the $11^{th}$ and $12^{th}$ source select transistors ST11 and ST12 included in the first memory block MB1 may become turned on, and thus the channel of the first memory block MB1 may be electrically connected to the first common source line CSL1.

Since the voltage (e.g. 5V) applied to the second source select line SSL2 is higher than the threshold voltage of the $22^{nd}$ source select transistor SST22 included in the unselected second memory block MB2, the $22^{nd}$ source select transistor SST22 may be turned on. However, since the voltage (e.g. −1V) applied to the first source select line SSL1 is lower than the threshold voltage of the $21^{st}$ source select transistor SST21 included in the unselected second memory block MB2, the $21^{st}$ source select transistor SST21 may become turned off. Therefore, the channel of the second memory block MB2 is not connected to the second common source line CSL2. Therefore, the second memory block MB2 may be the unselected memory block.

As described above, by changing the combination of voltages applied to the first and second source select lines SSL1 and SSL2 and by allowing all the source select transistors included in the selected memory block to be turned on and at least one of source select transistors included in the unselected memory blocks to be turned off, a desired memory block can be selected, and the selected memory block may be distinguished from the unselected memory blocks.

Figure 6:
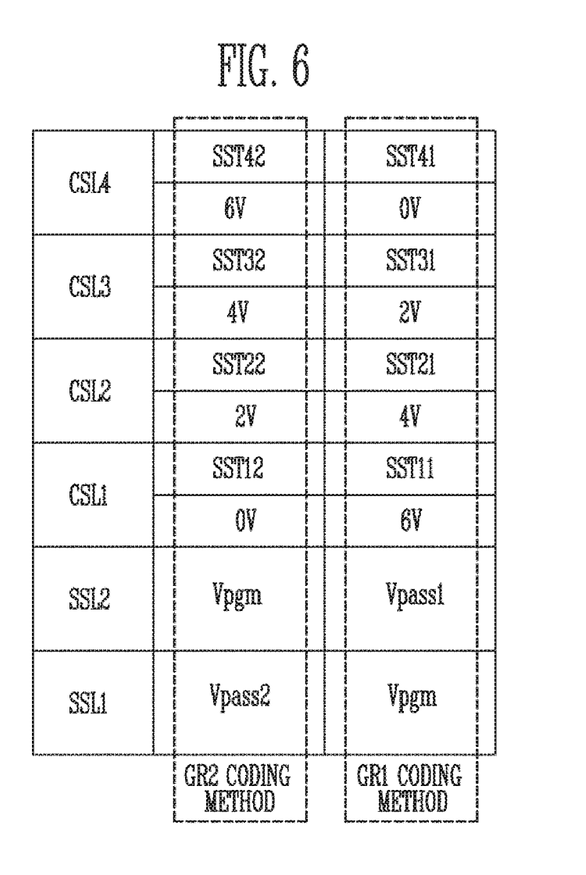
FIG. 6 is a diagram illustrating an example of a coding method according to an embodiment of the present disclosure.

FIG. 6 is a diagram illustrating an example of a coding method according to an embodiment of the present disclosure.

Referring to FIG. 6, a control circuit (e.g., the control circuit 300 of FIG. 2) may control operations of a peripheral circuit (e.g., the peripheral circuit 200 of FIG. 2) so that the source select transistors included in the first and second groups GR1 and GR2 are programmed as follows.

By adjusting the voltages applied to first to fourth common source lines CSL1 to CSL4 to different voltages, the source select transistors SST12, SST22, SST32 and SST42 included in the second group (GR2 of FIG. 4) may be simultaneously programmed, and then the source select transistors SST11, SST21, SST31 and SST41 included in the first group (GR1 of FIG. 4) may be simultaneously programmed.

More specifically, in order to simultaneously program the source select transistors SST12, SST22, SST32 and SST42 included in the second group (GR2 of FIG. 4), different voltages may be applied to the first to fourth common source lines CSL1 to CSL4 coupled to the first to fourth memory blocks MB1 to MB4. For example, when a program voltage Vpgm is applied to the second source select line SSL2 coupled to the second group GR2, a second pass voltage Vpass2 may be applied to the first source select line SSL1 coupled to the first group GR1, a voltage of 0V may be applied to the first common source line CSL1, a voltage of 2V may be applied to the second common source line CSL2, a voltage of 4V may be applied to the third common source line CSL3, and a voltage of 6V may be applied to the fourth common source line CSL4. That is, as shown in FIG. 5, the lowest voltage is applied to the first common source line CSL1 and the highest voltage is applied to the fourth common source line CSL4, and the closer the common source line is disposed to the fourth common source line CSL4, the higher voltage the common source line is applied with so that the threshold voltage may decrease as the source select transistor is disposed closer to the $42^{nd}$ source select transistor SST42 and farther from the $12^{th}$ source select transistor SST12. Accordingly, the $12^{th}$, $22^{nd}$, $32^{nd}$ and $42^{nd}$ source select transistors SST12, SST22, SST32 and SST42 included in the first to fourth memory blocks MB1 to MB4 may be programmed to have different threshold voltages due to voltage differences between respective channels.

In order to simultaneously program the source select transistors SST11, SST21, SST31 and SST41 included in the first group (GR1 of FIG. 4), for example, different voltages are applied to the first to fourth common source lines CSL1 to CSL4 coupled to the first to fourth memory blocks MB1 to MB4. However, coding is performed in such a way that voltages contrary to those in the program operation of the second group GR2 are applied to the first to fourth common source lines CSL1 to CSL4. For example, when a program voltage Vpgm is applied to the first source select line SSL1 coupled to the first group GR1, a first pass voltage Vpass1 is applied to the second source select line SSL2 connected to the second group GR2, a voltage of 6V, is applied to the first common source line CSL1, a voltage of 4V is applied to the second common source line CSL2, a voltage of 2V is applied to the third common source line CSL3, and a voltage of 0V is applied to the fourth common source line CSL4. That is, as shown in FIG. 5, the highest voltage is applied to the first common source line CSL1 and the lowest voltage is applied to the fourth common source line CSL4, and the closer the common source line is disposed to the fourth common source line CSL4, the lower voltage the common source line is applied so that the threshold voltage may increase as the source select transistor is disposed closer to the $41^{st}$ source select transistor SST41 and farther from the $11^{th}$ source select transistor SST11. When the program operation of the first group GR1 is performed, the first pass voltage Vpass1 that is applied to the second source select line SSL2 may be set to a voltage lower than the second pass voltage Vpass2 because the program operation of the second group GR2 has been completed. Accordingly, the $11^{th}$, $21^{st}$, $31^{st}$ and $41^{st}$ source select transistors SST11, SST21, SST31 and SST41 included in the first to fourth memory blocks MB1 to MB4 may be programmed to have different threshold voltages due to voltage differences between respective channels.

Figure 7:
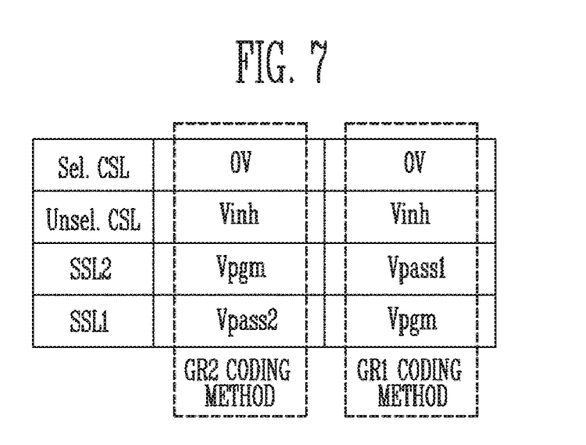
FIG. 7 is a diagram illustrating an example of a coding method according to an embodiment of the present disclosure.

FIG. 7 is a diagram illustrating an example of a coding method according to an embodiment of the present disclosure.

Referring to FIG. 7, the control circuit 300 (of FIG. 2) may control the peripheral circuit 200 so that, after source select transistors included in the second group GR2 have been respectively programmed by adjusting verification voltages, source select transistors included in the first group GR1 are respectively programmed. For example, a program permission voltage (e.g. 0V) may be applied to a selected common source line Sel. CSL coupled to a selected memory block, and a program inhibition voltage Vinh may be applied to unselected common source lines tinsel. CSL coupled to the unselected memory blocks.

More specifically, when the $12^{th}$ source select transistors (SST12 of FIG. 4) included in the second group GR2 are selected, a voltage of 0V is applied to the first common source line CSL1 and a program inhibition voltage Vinh is applied to the remaining second to fourth common source lines CSL2 to CSL4 so as to decrease the channel voltage of the first memory block (MB1 of FIG. 4) including the $12^{th}$ source select transistors SST12. As described above, when voltages are applied to the first to fourth common source lines CSL1 to CSL4, the $12^{th}$ source select transistors SST12 included in the selected first memory block MB1 may be simultaneously programmed by applying a program voltage Vpgm to the second source select line SSL2 and applying a second pass voltage Vpass2 to the first source select line SSL1. By using the above-described method, the $22^{nd}$ source select transistors SST22 included in the second memory block (MB2 of FIG. 4) may be simultaneously coded, the $32^{nd}$ source select transistors SST32 included in the third memory block (MB3 of FIG. 4) may be simultaneously coded, and the $42^{nd}$ source select transistors SST42 included in the fourth memory block (MB4 of FIG. 4) may be simultaneously coded. In order to perform coding in the same way as the $12^{th}$, $22^{nd}$, $32^{nd}$ and $42^{nd}$ source select transistors SST12, SST22, SST32 and SST42 of FIG. 5, the program verification voltage may be decreased as the source select transistors is disposed farther from the first memory block MB1 and closer to the fourth memory block MB4. The sequence of the program operation in the second group GR2 may vary. For example, the program operation may be performed in ascending order from the first memory block MB1 to the fourth memory block MB4, or in descending order from the fourth memory block MB4 to the first memory block MB1, or the sequence may be a random sequence.

When the coding of the second group GR2 has been completed, the $11^{th}$, $21^{st}$, $31^{st}$ and $41^{st}$ source select transistors (SST11, SST21, SST31 and SST41 of FIG. 4) included in the first group GR1 are coded. For example, when the $11^{th}$ source select transistors SST11 are selected, 0V is applied to the first common source line CSL1 and a program inhibition voltage Vinh is applied to the remaining second to fourth common source lines CSL2 to CSL4 so as to decrease the channel voltage of the first memory block (MB1 of FIG. 4) including the $12^{th}$ source select transistors SST12. As described above, when voltages are applied to the first to fourth common source lines CSL1 to CSL4, the $11^{th}$ source select transistors SST11 included in the selected first memory block MB1 may be simultaneously programmed by applying a program voltage Vpgm to the first source select line SSL1 and applying a first pass voltage Vpass1 to the second source select line SSL2. When the program operation of the first group GR1 is performed, the first pass voltage Vpass1 applied to the second source select line SSL2 may be set to a voltage lower than the second pass voltage Vpass2 because the program operation of the second group GR2 has been completed. By using the above-described method, the $21^{st}$ source select transistors SST21 included in the second memory block MB2 may be simultaneously coded, the 31-th source select transistors SST31 included in the third memory block MB3 may be simultaneously coded, and the 41-th source select transistors SST41 included in the fourth memory block MB4 may be simultaneously coded. In order to perform coding in the same way as the $12^{th}$, $22^{nd}$, $32^{nd}$ and $42^{nd}$ source select transistors SST12, SST22, SST32 and SST42 of FIG. 5, the program verification voltage may be increased as the source select transistors is disposed farther from the first memory block MB1 and closer to the fourth memory block MB4. The sequence of the program operation in the first group GR1 may vary. For example, the program operation may be performed in ascending order from the first memory block MB1 to the fourth memory block MB4, or in descending order from the fourth memory block MB4 to the first memory block MB1, or the sequence may be a random sequence.

Figure 8:
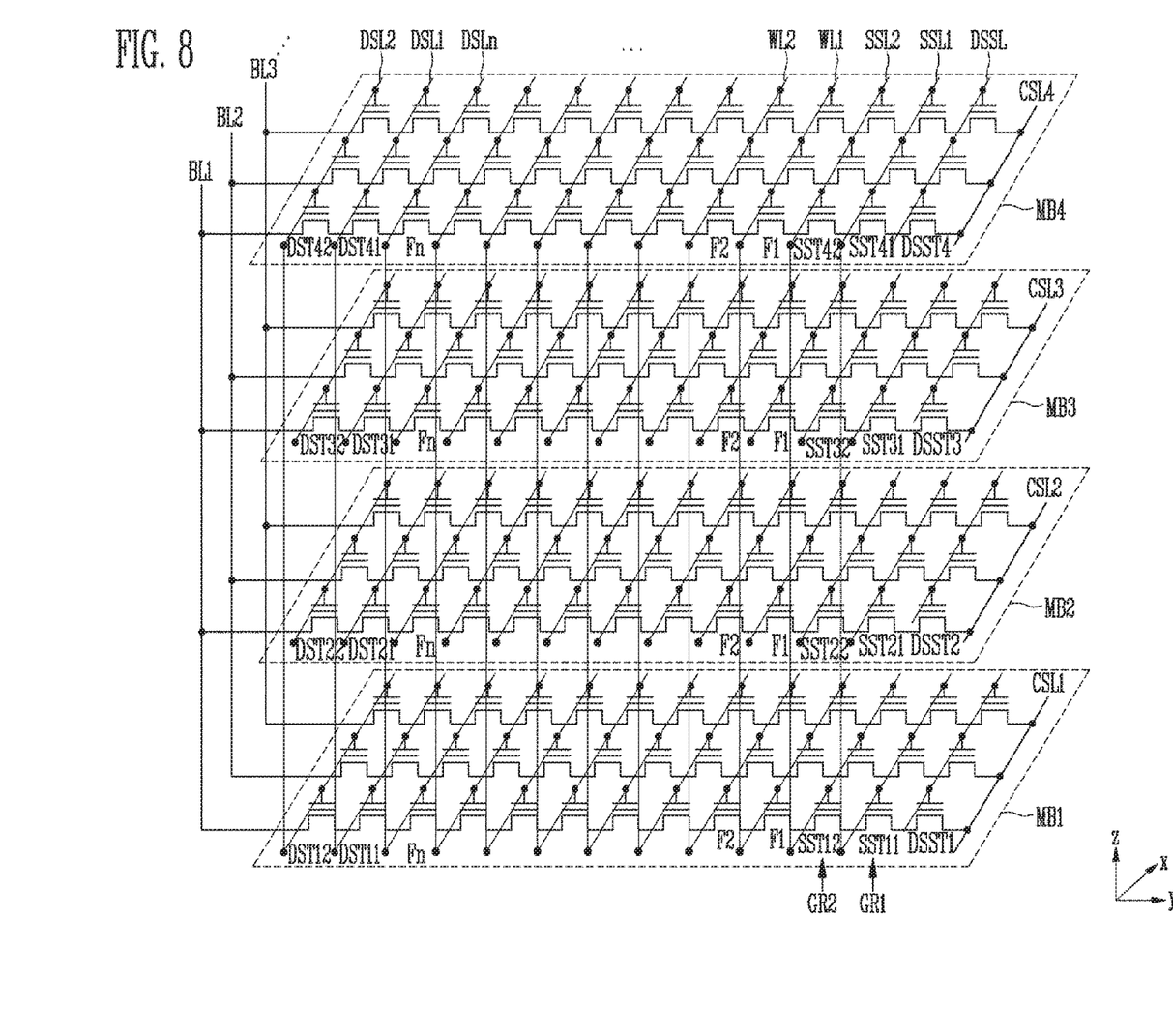
FIG. 8 is a diagram illustrating in detail examples of memory blocks according to an embodiment of the present disclosure.

FIG. 8 is a diagram illustrating in detail examples of memory blocks according to an embodiment of the present disclosure.

Referring to FIG. 8, each of first to fourth memory blocks MB1 to MB4 may further include dummy source select transistors DSST. Since the configuration of the first to fourth memory blocks MB1 to MB4 is similar to that of the first to fourth memory blocks MB1 to MB4 described above in FIG. 4, a detailed description thereof will be omitted.

First dummy source select transistors DSST1 are connected between the $11^{th}$ source select transistors SST11 of the first memory block MB1 and a first common source line CSL1, and the gates thereof are connected to a first dummy source select line DSSL1. Second dummy source select transistors DSST2 are connected between the $21^{st}$ source select transistors SST21 of the second memory block MB2 and a second common source line CSL2, and the gates thereof are connected to a second dummy source select line DSSL2. Third dummy source select transistors DSST3 are connected between the $31^{st}$ source select transistors SST31 of the third memory block MB3 and a third common source line CSL3, and the gates thereof are connected to a third dummy source select line DSSL3. Fourth dummy source select transistors DSST4 are connected between the $41^{st}$ source select transistors SST41 of the fourth memory block MB4 and a fourth common source line CSL4, and the gates thereof are connected to a fourth dummy source select line DSSL4.

The first to fourth dummy source select transistors DSST1 to DSST4 may be used for channel boosting required to increase the channel voltages of unselected memory blocks when the operation of coding the $11^{th}$ to $41^{st}$ source select transistors SST11 to SST41 and the $12^{th}$ to $42^{nd}$ source select transistors SST12 to SST42 is performed. A detailed operating method thereof will be described below.

Figure 9:
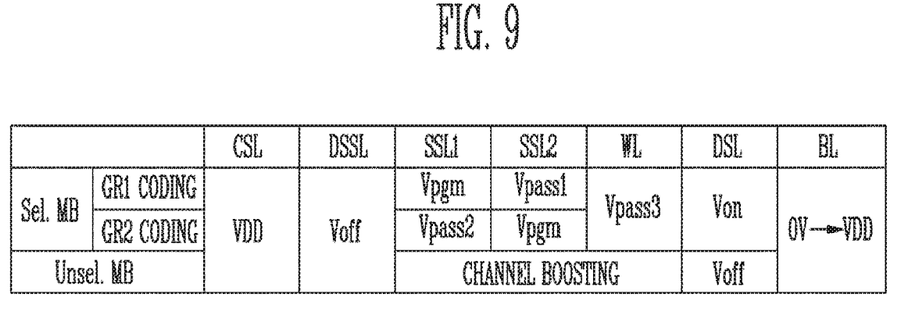
FIG. 9 is a diagram illustrating an example of a coding method according to an embodiment of the present disclosure.

FIG. 9 is a diagram illustrating an example of a coding method according to an embodiment of the present disclosure.

Referring to FIG. 9, the $11^{th}$ to $41^{st}$ drain select transistors DST11 to DST41 are coded, and the $12^{th}$ to $42^{nd}$ drain select transistors DST12 to DST42 are coded. The method of coding the $11^{th}$ to $41^{st}$ drain select transistors DST11 to DST41 and the $12^{th}$ to $42^{nd}$ drain select transistors DST12 to DST42 may be performed using the method described above with reference to FIG. 6 or 7. Then, the source select transistors respectively included in the first group GR1 and the second group GR2 are coded. In FIG. 9, voltages applied to the respective lines when source select transistors included in a selected memory block Sel. MB are coded are illustrated.

More specifically, when the operation of coding the first group GR1 of the selected memory block Sel. MB is given as an example, a supply voltage VDD may be applied to the common source lines CSLs coupled to the selected memory block Sel. MB and to unselected memory blocks Unsel. MB, and a turn-off voltage Voff may be applied to the dummy source select line DSSL. As a result, the first to fourth dummy source select transistors DSST1 to DSST4 may be turned off, and then the channels of the selected memory block Sel. MB and the unselected memory blocks Unsel. MB may be isolated from the common source line CSL.

In order to decrease the channel voltage of the selected memory block (Sel. MB), a program permission voltage e.g. 0V may be applied to bit lines BLs, and a third pass voltage Vpass3 may be applied to word lines WLs. The third pass voltage Vpass3 may be set to a positive voltage.

Thereafter, the voltages Von and Voff applied to the drain select lines may be adjusted so that the drain select transistors included in the unselected memory blocks Unsel. MB may be turned off and drain select transistors included in the selected memory block Sel. MB are turned on. Actually, since the drain select lines DSLs are coupled in common to the selected memory block Sel. MB and the unselected memory blocks Unsel. MB, the same drain select line voltage may be applied to the memory blocks. However, even if the same voltage is applied to the coded drain select transistors, the coded drain select transistors may be turned on or off due to different threshold voltages.

Since the bit lines BLs are discharged to 0V, the drain select transistors included in the selected memory block Sel. MB are turned on, and a voltage level of the channel of the selected memory block Sel. MB is decreased to 0V. Then, the source select transistors included in the first group GR1 may be programmed by applying a program voltage to the first source select line SSL1 and applying a first pass voltage Vpass1 to the second source select line SSL2. When the coding of the first group GR1 has been completed, the operation of coding the second group GR2 is performed. The operations of coding the first and second groups GR1 and GR2 may be performed using the method described above with reference to FIG. 6 or FIG. 7.

When the operations of coding the first and second groups GR1 and GR2 included in the selected memory block Sel. MB have been completed, channel boosting may be caused in the unselected memory blocks Unsel. MB by applying a supply voltage VDD to the bit lines BLs in an operation of programming the memory cells, which will be subsequently performed.

Figure 10:
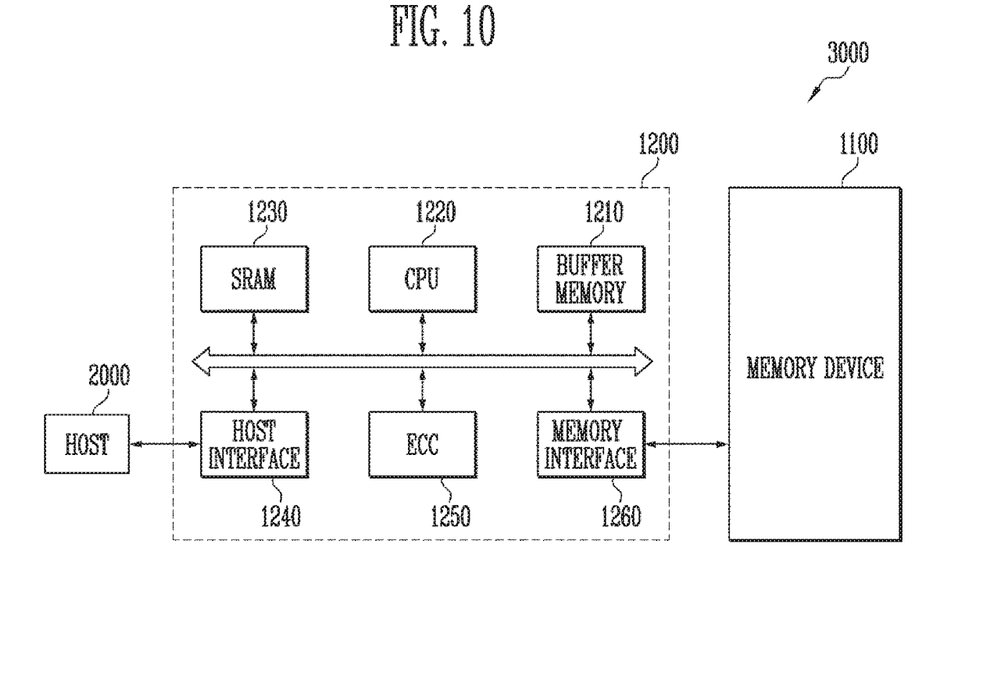
FIG. 10 is a diagram illustrating an example of a memory system according to an embodiment of the present disclosure.

FIG. 10 is a diagram illustrating an example of a memory system according to an embodiment of the present disclosure.

Referring to FIG. 10, a memory system 3000 may include a memory device 1100 for storing data and a controller 1200 for controlling the memory device 1100. Further, the controller 1200 may control communications between a host 2000 and the memory device 1100. The controller 1200 may include a buffer memory 1210, a Central Processing Unit (CPU) 1220, a Static Random Access Memory (SRAM) 1230, a host interface 1240, an Error Correction Code (ECC) unit 1250, and a memory interface 1260.

The buffer memory 1210 temporarily stores data while the controller 1200 controls the memory device 1100. The CPU 1220 may perform a control operation for data exchange in the controller 1200. The SRAM 1230 may be used as the working memory of the CPU 1220. The host interface 1240 may have a data exchange protocol for the host 2000 connected to the memory system 3000. The ECC unit 1250 is an error correction unit, which may detect and correct errors contained in data read from the memory device 1100. The memory interface 1260 may interface with the memory device 1110. Although not illustrated in FIG. 10, the memory system 3000 may further include a Read Only Memory (ROM) for storing code data for interfacing with the host 2000.

The host 2000 in which the memory system 3000 according to an embodiment of the present disclosure may be used may include a computer, an Ultra Mobile PC (UMPC), a workstation, a net-book, a Personal Digital Assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving information in a wireless environment, and various devices constituting a home network.

Figure 11:
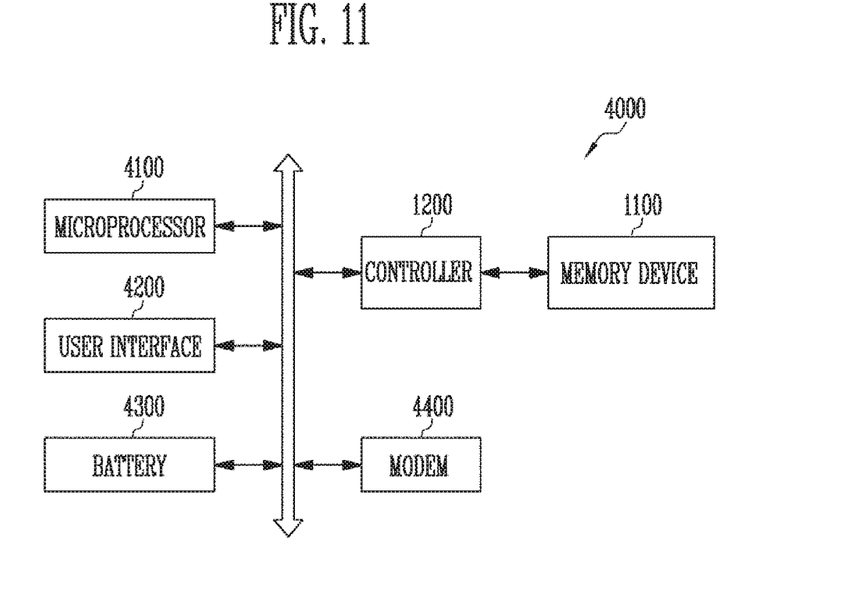
FIG. 11 is a diagram illustrating an example of a computing system including a memory system according to an embodiment of the present disclosure.

FIG. 11 is a diagram illustrating an example of a computing system including a memory system according to an embodiment of the present disclosure.

Referring to FIG. 11, a memory system 4000 according to an embodiment of the present disclosure may include a memory device 1110, a controller 1200, a microprocessor 4100, a user interface 4200, and a modem 4400, which are electrically connected to a bus. Further, when the memory system 4000 according to an embodiment of the present disclosure is a mobile device, a battery 4300 for supplying the operating voltage of the memory system 4000 may be further included. Although not illustrated in the drawing, the memory system 4000 according to the present disclosure may further include an application chip set, a Camera Image Processor (CIS), a mobile DRAM, etc. The controller 1200 and the memory device 1110 may constitute a Solid State Drive/Disk (SSD).

The memory system 4000 according to an embodiment of the present disclosure may be made using various types of packages. For example, the memory system 4000 according to an embodiment of the present disclosure may be made using packages, such as a Package on Package (PoP), a Ball grid array (BGA), a Chip Scale package (CSP), a Plastic Leaded Chip Carrier (PLCC), a Plastic Dual In-Line Package (PDIP), a Die in Waffle pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a System In Package (SIP), a Multi Chip Package (MCP), a Wafer-level Fabricated Package (WFP), and a Wafer-Level Processed Stack Package (WSP).

Various embodiments of the present disclosure may improve the reliability of a read operation of a memory device, and also improve the reliability of a memory system including the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a first cell string coupled between a first bit line and a first common source line, wherein the first cell string is selectively coupled to the first common source line by first select transistors having different threshold voltages;
a second cell string coupled between a second bit line and the first common source line, wherein the second cell string is selectively coupled to the first common source line by second select transistors having different threshold voltages;
a third cell string coupled between the first bit line and a second common source line, and stacked on the first cell string, wherein the third cell string is selectively coupled to the second common source line by third select transistors having different threshold voltages; and
a fourth cell string coupled between the second bit line and the second common source line, and stacked on the second cell string,
wherein the fourth cell string is selectively coupled to the second common source line by fourth select transistors having different threshold voltages,
wherein different voltages are applied to the first common source line and the second common source line, respectively, when the first to fourth select transistors are programmed to have the different threshold voltages.

2. The memory device according to claim 1, wherein:
the first and second cell strings are included in a first memory block, and the third and fourth cell strings are included in a second memory block.

3. The memory device according to claim 2, wherein:
the first and second select transistors comprise source select transistors in the first memory block, and the third and fourth select transistors comprise source select transistors in the second memory block.

4. The memory device according to claim 1, further comprising:
a first drain select transistors having different threshold voltages coupled between the first cell string and the first bit line;
a second drain select transistors having different threshold voltages coupled between the second cell string and the first bit line;
a third drain select transistors having different threshold voltages coupled between the third cell string and the first bit line;
a fourth drain select transistors having different threshold voltages coupled between the fourth cell string and the first bit line.

5. The memory device according to claim 1, wherein:
gates of the first and second select transistors adjacent to the first common source line are coupled to a first source select line, gates of the first and second select transistors adjacent to memory cells in the first and second cell strings are coupled to a second source select line, gates of the third and fourth select transistors adjacent to the second common source line are coupled to a third source select line, and gates of the third and fourth select transistors adjacent to memory cells in the third and fourth cell strings are coupled to a fourth source select line.

6. The memory device according to claim 5, further comprising a voltage generation circuit configured to generate a program voltage and a pass voltage to be applied to the first or second source select line so that the first and second select transistors have the different threshold voltages.

7. The memory device according to claim 6, wherein the voltage generation circuit generates the different voltages to be applied to the first or second common source line.

* * * * *